US010833140B1

(12) United States Patent
Mo et al.

(10) Patent No.: US 10,833,140 B1
(45) Date of Patent: Nov. 10, 2020

(54) DISPLAY SUBSTRATE, MANUFACTURING METHOD THEREOF, DISPLAY DEVICE AND MASK PLATE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Zailong Mo, Beijing (CN); Zhiyong Yang, Beijing (CN); Fan Yang, Beijing (CN); Da Zhou, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/886,100

(22) Filed: May 28, 2020

Related U.S. Application Data

(63) Continuation-in-part of application No. 15/996,047, filed on Jun. 1, 2018, now Pat. No. 10,686,021.

(30) Foreign Application Priority Data

Jul. 28, 2017 (CN) .......................... 2017 1 0629547

(51) Int. Cl.
*H01L 27/32* (2006.01)
*H01L 51/52* (2006.01)
(Continued)

(52) U.S. Cl.
CPC ....... *H01L 27/3246* (2013.01); *G09G 3/3258* (2013.01); *H01L 51/5206* (2013.01); *H01L 51/5221* (2013.01); *H01L 51/56* (2013.01)

(58) Field of Classification Search
CPC . H01L 27/3246; H01L 51/5206; H01L 51/56; H01L 51/5225; H01L 51/5221;
(Continued)

(56) References Cited

U.S. PATENT DOCUMENTS

2004/0239238 A1 12/2004 Lee
2017/0345847 A1* 11/2017 Kim .................... H01L 51/5246
(Continued)

*Primary Examiner* — Muhammad N Edun
(74) *Attorney, Agent, or Firm* — Dilworth & Barrese, LLP.; Michael J. Musella, Esq.

(57) ABSTRACT

A display substrate, a manufacturing method thereof, a display device, and a mask plate are provided. The display substrate includes: a base substrate including a display region and a peripheral region, the peripheral region including a first peripheral region and a second peripheral region; a first power voltage terminal located in the first peripheral region; a first power signal line located in the display region and configured to be electrically connected with the first power voltage terminal; and a pixel defining layer, an edge of the pixel defining layer including a slope. The second peripheral region includes a first sub-region and a second sub-region located on a side of the first sub-region away from the first power voltage terminal, and an average slope angle of the slope located in the first sub-region is greater than an average slope angle of the slope located in the second sub-region.

20 Claims, 4 Drawing Sheets

(51) Int. Cl.
*G09G 3/3258* (2016.01)
*H01L 51/56* (2006.01)
(58) Field of Classification Search
CPC ............. H01L 51/0096; H01L 51/0011; H01L 2251/558; G09G 3/3258; G03F 1/64
See application file for complete search history.

(56) References Cited

U.S. PATENT DOCUMENTS

2018/0231853 A1\* 8/2018 Yamamoto ............... G06F 3/044
2018/0294322 A1  10/2018 Han
2019/0296099 A1\* 9/2019 Lee ..................... H01L 27/3246

\* cited by examiner

DISPLAY SUBSTRATE, MANUFACTURING METHOD THEREOF, DISPLAY DEVICE AND MASK PLATE

This application is a continuation-in-part of U.S. Ser. No. 15/996,047 filed on Jun. 1, 2018, which claims priority to Chinese patent application No. 201710629547.1 filed on Jul. 28, 2017. The entire disclosure of these applications is incorporated herein by reference as part of the present application.

TECHNICAL FIELD

Embodiments of the present disclosure relate to a display substrate, a manufacturing method thereof, a display device, and a mask plate.

BACKGROUND

In an organic light emitting diode (OLED) display device, a drive circuit (IC) inputs a Vss (e.g., a negative voltage) signal to a cathode of each organic light emitting element in the OLED display device, the IC inputs a Vdd (e.g., a positive voltage) signal to an anode of each organic light emitting element in the OLED display device, and a voltage difference between the Vdd signal and the Vss signal is a drive voltage $\Delta V$. A light emitting material of each organic light emitting element is driven by the drive voltage $\Delta V$ to emit light.

Because a power signal line of the OLED display device transmitting the Vdd signal has a certain impedance, compared with the Vdd signal at the near end of the IC (i.e., a position near a voltage terminal of the IC), the Vdd signal at the far end of the IC (i.e., a position away from the voltage terminal of the IC) has a certain voltage drop, resulting in a difference between the driving voltage $\Delta V$ at the far end of the IC and the driving voltage $\Delta V$ at the near end of the IC. A display problem of long range uniformity (LRU) appears, and as the screen size increases and the average display brightness increases, the LRU is worse, making it difficult to achieve high-quality display. Especially for monochrome gray scale pictures, it can be clearly seen that the display brightness at the near end of the IC is higher than that at the far end of the IC.

SUMMARY

The present disclosure provides a display substrate, a manufacturing method thereof, a display device, and a mask plate.

At least one embodiment of the present disclosure provides a display substrate, including: a base substrate, including a display region and a peripheral region surrounding the display region, the peripheral region including a first peripheral region extending in a first direction and a second peripheral region extending in a second direction, the first direction intersecting the second direction, and a size of the display region in the second direction being not greater than a size of the second peripheral region in the second direction; a first power voltage terminal, located in the first peripheral region of the base substrate, and configured to provide a first power voltage signal to an organic light emitting element located in the display region; a first power signal line, located in the display region and extending in the second direction, the first power signal line being configured to be electrically connected with the first power voltage terminal; and a pixel defining layer, located in the display region and the peripheral region of the base substrate, and located at a side of the first power signal line away from the base substrate, the pixel defining layer being extended continuously from the display region to the peripheral region, and an edge of the pixel defining layer in the peripheral region including a slope. The second peripheral region includes at least two sub-regions arranged along the second direction, the at least two sub-regions include a first sub-region and a second sub-region, the second sub-region is located on a side of the first sub-region away from the first power voltage terminal, and an average slope angle of the slope located in the first sub-region is greater than an average slope angle of the slope located in the second sub-region.

For example, in an embodiment of the present disclosure, the second peripheral region includes only two sub-regions, in the second direction, a ratio of a length of the first sub-region to a length of the second sub-region ranges from 2.5 to 3.5, and lengths of the first sub-region and the second sub-region in the second direction are not less than 4 microns.

For example, in an embodiment of the present disclosure, a ratio of an average slope angle of the slope located in the first peripheral region to the average slope angle of the slope located in the first sub-region ranges from 0.90 to 1.10.

For example, in an embodiment of the present disclosure, the display substrate further includes: a second power voltage terminal, located in the first peripheral region; and a second power signal line, located in the peripheral region and configured to be electrically connected with the second power voltage terminal to receive a second power voltage signal; the second power signal line includes a first conductive layer, at least a part of the first conductive layer is located on the slope, and an average thickness of the first conductive layer located on the slope in the first sub-region is smaller than an average thickness of the first conductive layer located on the slope in the second sub-region.

For example, in an embodiment of the present disclosure, at least one sub-region is are further provided between the first sub-region and the second sub-region, and average slope angles of the slope of the pixel defining layer in the sub-regions gradually decrease in a direction in which the first sub-region points to the second sub-region.

For example, in an embodiment of the present disclosure, the second power signal line further includes a second conductive layer located at a side of the first conductive layer facing the base substrate, the second conductive layer includes a first flat portion and a second flat portion, the first flat portion is located at a side of the second flat portion close to the display region, a portion of the first flat portion close to the second flat portion is in direct contact with the first conductive layer, and a portion of the first flat portion away from the second flat portion is located between the pixel defining layer and the base substrate; the second power signal line further includes a third conductive layer disposed on the same layer as the first power signal line, and the third conductive layer is located at a side of the second flat portion facing the base substrate and is in direct contact with the second flat portion.

For example, in an embodiment of the present disclosure, an orthographic projection of the first conductive layer on the base substrate is not overlapped with an orthographic projection of the third conductive layer on the base substrate, and a surface of the third conductive layer facing the base substrate is parallel to a surface of the base substrate.

For example, in an embodiment of the present disclosure, the second power signal line is an annular signal line surrounding the display region.

For example, in an embodiment of the present disclosure, the display substrate further includes: a plurality of organic light emitting elements. Each of the plurality of organic light emitting elements includes a first electrode, an organic light emitting layer, and a second electrode which are sequentially stacked, the first electrode is located at a side of the second electrode away from the base substrate, first electrodes of the plurality of organic light emitting elements form to be a continuous film layer, so that the plurality of organic light emitting elements share one first electrode, and the first electrode is electrically connected with the second power voltage terminal through the first conductive layer; the second conductive layer is disposed on the same layer as and spaced apart from the second electrode of each organic light emitting element, and the first power voltage terminal is configured to provide the first power voltage signal to the second electrode through the first power signal line.

For example, in an embodiment of the present disclosure, the first electrode and the first conductive layer are integrated as an integrated structure.

For example, in an embodiment of the present disclosure, the base substrate has a rectangular shape, the base substrate includes two first peripheral regions opposite to each other and two second peripheral regions opposite to each other, the first power voltage terminal and the second power voltage terminal are located in the same one of the two first peripheral region, and each of the two second peripheral region includes the first sub-region and the second sub-region.

For example, in an embodiment of the present disclosure, the pixel defining layer located in the peripheral region includes the slope and a third flat portion, the third flat portion is located at a side of the slope close to the display region, and a thickness of the first conductive layer located on the slope is smaller than a thickness of the first conductive layer located on the third flat portion.

For example, in an embodiment of the present disclosure, an orthographic projection of the slope in the second peripheral region on the base substrate includes a plurality of protrusions arranged in the second direction, a distance between centerlines of adjacent two protrusions in the second sub-region is greater than a distance between centerlines of adjacent two protrusions in the first sub-region.

Another embodiment of the present disclosure provides a display device, including the above display substrate.

Another embodiment of the present disclosure provides a mask plate for forming the pixel defining layer in the peripheral region of any one of the above display substrate, including: a first edge extending in the first direction and a second edge extending in the second direction, the second edge includes a plurality of notches arranged in a row along the second direction to form a serrated edge, the second edge includes at least two mask regions arranged along the second direction, the at least two mask regions include a first mask region corresponding to the first sub-region and a second mask region corresponding to the second sub-region, and a size of each notch in the first mask region along the second direction is smaller than a size of each notch in the second mask region along the second direction.

For example, in an embodiment of the present disclosure, sizes of the notches in the first mask region along the second direction are equal, and sizes of the notches in the second mask region along the second direction are equal.

For example, in an embodiment of the present disclosure, a size of an interval between two adjacent ones of the notches in the first mask region along the second direction is equal to a size of an interval between two adjacent ones of multiple notches in the second mask region along the second direction.

Another embodiment of the present disclosure provides a manufacturing method of a display substrate using the above mask plate, including: providing the base substrate; and forming a pixel defining material layer on the base substrate; patterning the pixel defining material layer in the first sub-region and the second sub-region by using the mask plate to form the pixel defining layer having the slope in the peripheral region. The average slope angle of the slope of the pixel defining layer formed in the first sub-region to be larger than the average slope angle of the slope of the pixel defining layer formed in the second sub-region.

For example, in an embodiment of the present disclosure, the manufacturing method of the display substrate further includes: forming a first conductive material layer on a side of the pixel defining layer away from the base substrate, the first conductive material layer includes a first conductive pattern layer located in the peripheral region, and an average thickness of the first conductive pattern layer located on the slope in the first sub-region is smaller than an average thickness of the first conductive pattern layer located on the slope in the second sub-region.

For example, in an embodiment of the present disclosure, forming the pixel defining layer further includes: patterning the pixel defining material layer located in the display region to form a plurality of openings, and before forming the pixel defining layer, the manufacturing method further includes: forming a second conductive material layer on the base substrate; patterning the second conductive material layer to form the first power signal line located in the display region and extending in the second direction and a second conductive pattern layer located in the peripheral region; forming a third conductive material layer on a side of the second conductive material layer away from the base substrate; and patterning the third conductive material layer to form a plurality of electrode blocks located in the display region and a third conductive pattern layer located in the peripheral region, the plurality of openings expose the plurality of electrode blocks, the third conductive pattern layer includes a first flat portion and a second flat portion, the first flat portion is located at a side of the second flat portion close to the display region, a portion of the first flat portion close to the second flat portion is in direct contact with the first conductive pattern layer, and the second flat portion is in direct contact with the second conductive pattern layer; after the pixel defining layer is formed, the manufacturing method further includes: forming an organic light emitting layer in the plurality of openings of the pixel defining layer, so as to allow the organic light emitting layer to be in contact with the plurality of electrode blocks, a portion of the first conductive material layer located in the display region is a first electrode of each organic light emitting element, each of the plurality of the electrode blocks is a second electrode of each organic light emitting element, each of the plurality of the electrode blocks is a second electrode of each organic light emitting element, the display substrate further includes a second power signal line located in the peripheral region, and the second power signal line includes the first conductive pattern layer, the second conductive pattern layer, and the third conductive pattern layer.

Another embodiment of the present disclosure provides a display substrate, including: a base substrate, including a display region and a peripheral region surrounding the display region, the peripheral region including a first peripheral region extending in a first direction and a second peripheral region extending in a second direction, the first direction intersecting the second direction, and a size of the display region in the second direction being not greater than a length of the second peripheral region; a voltage terminal, located in the first peripheral region, and comprising a first power voltage terminal and a second power voltage terminal, the first power voltage terminal being configured to provide a first power voltage signal to an organic light emitting element located in the display region, and the second power voltage terminal being configured to provide a second power voltage signal to the organic light emitting element; a first power signal line, located in the display region and extending in the second direction, the first power signal line being configured to be electrically connected with the first power voltage terminal; a second power signal line, located in the peripheral region and configured to be electrically connected with the second power voltage terminal; the second peripheral region includes at least two sub-regions arranged along the second direction, the at least two sub-regions include a first sub-region and a second sub-region, the second sub-region is located on a side of the first sub-region away from the voltage terminal, the second power signal line includes a conductive layer, and a sheet resistance of the conductive layer located in the first sub-region is greater than a sheet resistance of the conductive layer located in the second sub-region.

BRIEF DESCRIPTION OF THE DRAWINGS

In order to clearly illustrate the technical solutions of the embodiments of the present disclosure, the drawings of the embodiments will be briefly described in the following; it is obvious that the described drawings below are only related to some embodiments of the present disclosure and thus are not limitative to the present disclosure.

DETAILED DESCRIPTION

Figure 1A:
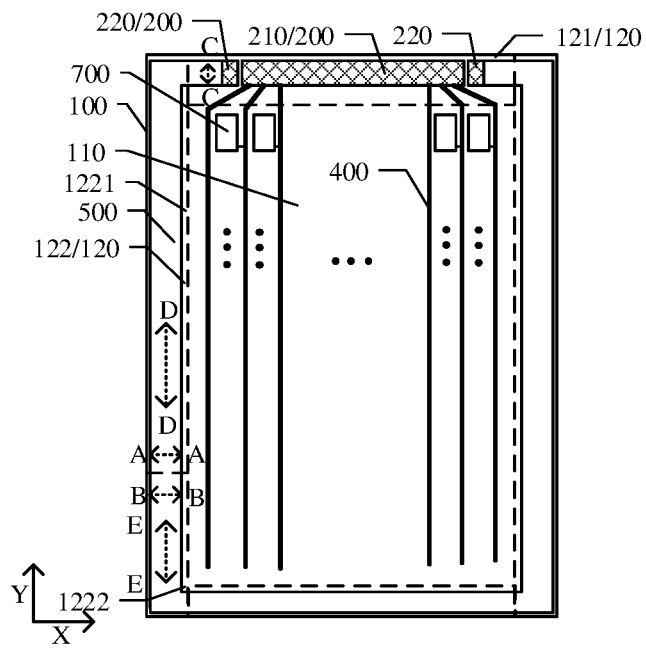
FIG. 1A is a schematic diagram of a partial planar structure of a display substrate according to an example of an embodiment of the present disclosure.

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects.

In the OLED display device, a Vss signal is input to a cathode by an IC (i.e. a driving circuit), and a Vdd signal is input to an anode by the IC. A voltage difference between the Vdd signal and the Vss signal is a driving voltage $\Delta V$ which drives the light-emitting material to emit light.

Since the power voltage line of the OLED display device has a certain impedance, in a direction from a position close to IC to a position away from IC, the Vdd signal at a distal end of the IC has a certain voltage drop compared to the Vdd signal at a proximal end of the IC, resulting in a difference in the driving voltage $\Delta V$ between the distal end and the proximal end of the IC and thus occurrence of a problem in LRU, i.e., the long-run display brightness of the OLED display device is uniform. Moreover, as the screen size increases, the average brightness of the display increases and the LRU becomes worse, making it difficult to achieve high-quality display, and especially for monochrome gray-scale images, it can be evidently seen that the display brightness at the proximal end of the IC is higher than that at the distal end of the IC.

In order to solve this problem, embodiments of the present disclosure provide a mask plate, an OLED display substrate a method for manufacturing the OLED display substrate, and a display device, which are capable of improving the problem of the uniform display brightness of the display device, thereby improving the display quality thereof.

When preparing a cathode on the substrate on which a pattern of a pixel defining layer has been formed, such as depositing the cathode on the substrate on which the pattern of the pixel defining layer has been formed, a thickness of the cathode on a slope of the pattern of the pixel defining layer is related to a slope angle of the pattern of the pixel defining layer. More specifically, the larger the slope angle of the pattern of the pixel defining layer is, the steeper the slope of the pattern of the pixel defining layer is, the smaller the thickness of a portion of the cathode located on the slope of the pattern of the pixel defining layer is when the cathode is deposited, and the greater the resistance of this portion of the cathode is; the smaller the slope angle of the pattern of the pixel defining layer is, the gentler the slope of the pattern of the pixel defining layer is, the thickness of a portion of the cathode located on the slope of the pattern of the pixel defining layer is when the cathode is deposited, and the smaller the resistance of this portion of the cathode is. Meanwhile, the slope angle of the pattern of the pixel defining layer is related to the width of an opening of the mask plate for preparing the pattern of the pixel defining layer. Specifically, the larger the opening of the mask plate for preparing the pattern of the pixel defining layer is, the smaller the slope angle of the pattern of the pixel defining layer is, and the smaller the opening of the mask plate for preparing the pattern of the pixel defining layer is, and the greater the slope angle of the pattern of the pixel defining layer is. Therefore, it is possible to change the slope angle of the pattern of the pixel defining layer by controlling the width of the opening of the mask plate for preparing the pattern of the pixel defining layer, thus changing the resistance of the portion of the cathode located on the slope of the pattern of the pixel defining layer.

Figure 2:
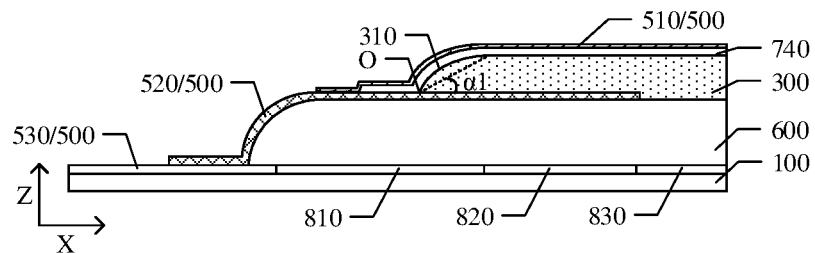
FIG. 2 is a schematic diagram of a partial cross-sectional structure taken along a line AA shown in FIG. 1A.
Figure 3:
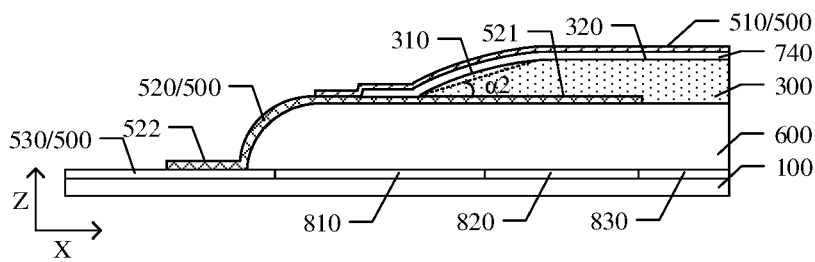
FIG. 3 is a schematic diagram of a partial cross-sectional structure taken along a line BB shown in FIG. 1A.

FIG. 1A is a schematic diagram of a partial planar structure of a display substrate according to an example of an embodiment of the present disclosure; FIG. 2 is a schematic diagram of a partial cross-sectional structure taken along a line AA shown in FIG. 1A; and FIG. 3 is a schematic diagram of a partial cross-sectional structure taken along a line BB shown in FIG. 1A. As illustrated by FIG. 1A, FIG. 2 and FIG. 3, the display substrate includes a base substrate 100, a voltage terminal 200, and a pixel defining layer 300. The voltage terminal 200 and the pixel defining layer 300 are located on the base substrate 100. The display substrate includes a display region 110 and a peripheral region 120 surrounding the display region 110. The display region 110 is a region for display and may include a plurality of organic light emitting elements, pixel circuits, etc. The peripheral region 120 is a non-display region located at the periphery of the display region 110. The peripheral region 120 may include a drive circuit (IC), various wirings, and other structures. The peripheral region 120 includes a first peripheral region 121 extending in a first direction (X direction shown in FIG. 1A) and a second peripheral region 122 extending in a second direction (Y direction shown in FIG. 1A). The first direction intersects with the second direction, for example, the first direction may be perpendicular to the second direction. A size of the display region 110 in the second direction is not greater than a length of the second peripheral region 122, that is, in the second direction, the size of the display region 110 is not greater than a size of the second peripheral region 122. For example, the display region 110 includes an edge adjacent to the second peripheral region 122, and a size of the edge in the second direction is less than or equal to the size of the second peripheral region 122 in the second direction. For example, the second peripheral region has a shape of a complete strip, and the first peripheral region and the second peripheral region form a closed region surrounding the display region.

As illustrated by FIG. 1A, FIG. 2 and FIG. 3, the voltage terminal 200 is located in the first peripheral region 121. For example, the voltage terminal 200 may be a port for an output signal of a drive circuit, and may include a port for outputting a positive voltage and a port for outputting a negative voltage. The pixel defining layer 300 is located in the display region 110 and the peripheral region 120, an edge of the pixel defining layer 300 is located in the peripheral region 120, and includes a slope 310. That is, the pixel defining layer is extended continuously from the display region to the peripheral region, and an edge of the pixel defining layer in the peripheral region includes a slope. The abovementioned pixel defining layer is a continuous film layer extending from the display region to the peripheral region, the continuous film layer has an edge in the peripheral region, and the edge in the peripheral includes a slope.

As illustrated by FIG. 1A, FIG. 2 and FIG. 3, the second peripheral region 122 includes at least two sub-regions arranged along the second direction, and the at least two sub-regions include a first sub-region 1221 and a second sub-region 1222, the second sub-region 1222 is located on a side of the first sub-region 1221 away from the voltage terminal 200. An orthographic projection of the first sub-region 1221 on the base substrate 100 is not overlapped with an orthographic projection of the second sub-region 1222 on the base substrate 100.

For example, lengths of the first sub-region 1221 and the second sub-region 1222 in the second direction are not less than 4 microns. For example, the lengths of the first sub-region 1221 and the second sub-region 1222 in the second direction are not less than 10 microns. For example, the lengths of the first sub-region 1221 and the second sub-region 1222 in the second direction are not less than 20 microns. For example, the lengths of the first sub-region 1221 and the second sub-region 1222 in the second direction are not less than 50 microns.

As illustrated by FIG. 1A, FIG. 2 and FIG. 3, an average slope angle $\alpha 1$ of the slope 310 of the pixel defining layer 300 located in the first sub-region 1221 is larger than an average slope angle $\alpha 2$ of the slope 310 of the pixel defining layer 300 located in the second sub-region 1222. The embodiments of the present disclosure set the average slope angle of the slope of the pixel defining layer away from the voltage terminal to be smaller than the average slope angle of the slope of the pixel defining layer close to the voltage terminal, so that an average thickness of a film layer formed on the slope of the pixel defining layer away from the voltage terminal can be larger than an average thickness of the film layer formed on the slope of the pixel defining layer close to the voltage terminal. In the present disclosure, the slope angle of the slope 310 is schematically defined by an angle between a plane parallel to the substrate 100 and a line connecting a vertex O of the slope 310 of the pixel defining layer 300 and an end point of the slope 310 (a position where the slope 310 is jointed to the flat portion 320). The present disclosure is not limited thereto, for example, the slope angle of the slope 310 can also be defined by an angle between a plane parallel to the substrate 100 and a line connecting a point at the position half of the pixel defining layer 300 and the vertex O of the slope 310. For example, the slope angle of the slope may also be defined by an angle between a tangent line at the vertex O of the slope and a plane parallel to the substrate.

The "average slope angle" of the slope of the pixel defining layer in each sub-region refers to an average value of the slope angles of the slope at different positions in each sub-region, in the case where the slope angles of the slope at different positions of the pixel defining layer in each sub-region may be different (for example, a ratio of the slope angles of the slope at different positions in each sub-region may be 0.8-1.2). Accordingly, the magnitude relationship between the slope angles of the slope in different sub-regions in the present embodiment refers to the magnitude relationship between the average slope angles of the slope in different sub-regions.

For example, as illustrated by FIG. 1A, at least two sub-regions may include only two sub-regions, i.e., the first sub-region 1221 and the second sub-region 1222, and in the second direction, a ratio of the length of the first sub-region 1221 to the length of the second sub-region 1222 may be 2.5 to 3.5. For example, the ratio of the length of the first sub-region 1221 to the length of the second sub-region 1222 may be 3, thereby simplifying the design of the edge of the pixel defining layer in the second peripheral region and reducing the costs.

Figure 4:
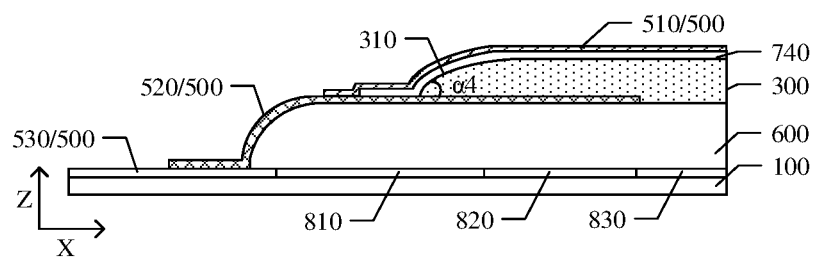
FIG. 4 is a schematic diagram of a partial cross-sectional structure of a display substrate according to another example of the present embodiment.

For example, FIG. 4 is a schematic diagram of a partial cross-sectional structural of a peripheral region of a display substrate provided by another example of the present embodiment. As illustrated by FIG. 2 to FIG. 4, in another example of the present embodiment, a number of sub-regions included in the second peripheral region may be more than 3, i.e., at least one sub-region is provided between the first sub-region and the second sub-region. In this case, in a direction from a position close to the voltage terminal to a position away from the voltage terminal, i.e., in the direction in which the first sub-region points to the second sub-region, the average slope angles of the slope of the pixel defining layer in the sub-regions gradually decreases, so that the average slope angles of the slope of the pixel defining layer in the sub-regions change more uniformly. That is, the slope of the pixel defining layer in each of the sub-regions has an average slope angle, and the average slope angles of the slope in the sub-regions have a gradually decreasing trend in the direction from the first sub-region to the second sub-region. In this case, the slope angles of the slope in the adjacent two sub-regions may be the same or different as long as the average slope angles of the slope in the sub-regions have a gradually decreasing trend. FIG. 4 is a cross-sectional view of a slope of the pixel defining layer in a sub-region between the first sub-region and the second sub-region. As illustrated by FIG. 2 to FIG. 4, the average slope angle α4 of the slope 310 of the pixel defining layer 300 of the sub-region between the first sub-region and the second sub-region is smaller than the average slope angle α1 in the first sub-region and larger than the average slope angle α2 in the second sub-region.

Figure 5:
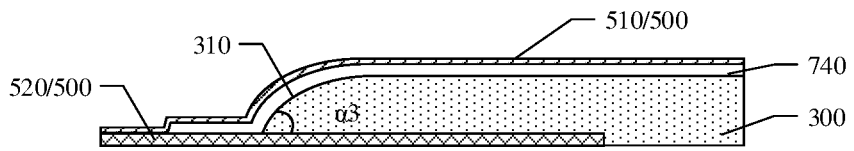
FIG. 5 is a schematic diagram of a partial cross-sectional structure taken along a line CC shown in FIG. 1A.

For example, FIG. 5 is a schematic diagram of a partial cross-sectional structure taken along a line CC shown in FIG. 1A. As illustrated by FIG. 1A, FIG. 2 and FIG. 5, a ratio of the average slope angle α3 of the slope 310 of the pixel defining layer 300 located in the first peripheral region 121 to the average slope angle α1 of the slope 310 located in the first sub-region 1221 is 0.90 to 1.10. For example, the average slope angle α3 of the slope 310 of the pixel defining layer 300 located in the first peripheral region 121 is substantially the same as the average slope angle α1 of the slope 310 located in the first sub-region 1221, thereby facilitating the manufacture of the pixel defining layer. FIG. 5 only illustrates some films close to the pixel defining layer, and other films are omitted.

For example, as illustrated by FIG. 1A, the base substrate 100 may have a rectangular shape, i.e., the display substrate may have a rectangular shape; the display substrate includes two first peripheral regions 121 opposite to each other and two second peripheral regions 122 opposite to each other, the voltage terminal 200 is located in one of the two first peripheral regions 121, and each of the two second peripheral region 122 includes the first sub-region 1221 close to the voltage terminal 200 and the second sub-region 1222 away from the voltage terminal 200. That is, the peripheral region 120 includes two first peripheral regions 121, two first sub-regions 1221, and two second sub-regions 1222; both of the two first sub regions 1221 are regions close to the voltage terminal 200.

For example, average slope angles of slope 310 of the pixel defining layer 300 located in other regions of the peripheral region 120 except the two second sub-regions 1222 (e.g., the two first peripheral regions 121 and the two first sub-regions 1221) are approximately the same to facilitate the design and manufacture of the pixel defining layer. That is, an average slope angle of the slope of the pixel defining layer in another first peripheral region other than the first peripheral region where the voltage terminal is located is approximately the same as that of the slope of the pixel defining layer in the first sub-region.

For example, as illustrated by FIG. 1A, FIG. 2, and FIG. 3, the display substrate further includes a first power signal line 400 and a second power signal line 500, which are insulated from each other. The first power signal line 400 is located in the display region 110 and extends in the second direction. The second power signal line 500 is located in the peripheral region 120. The voltage terminal 200 includes a first power voltage terminal 210 and a second power voltage terminal 220, the first power voltage terminal 210 is electrically connected with the first power signal line 400 to provide a first power voltage signal to an organic light emitting element located in the display region, and the second power voltage terminal 220 is electrically connected with the second power signal line 500 to provide a second power voltage signal to the organic light emitting element. The first power voltage signal can be a Vdd signal to the anode of OLED, the second power voltage signal can be a Vss signal to the cathode of OLED.

For example, as illustrated by FIG. 1A, the second power signal line 500 may be an annular signal line surrounding the display region 110. For example, the second power signal line 500 may be located in the two second peripheral regions 122, a part of the first peripheral region 121 where the voltage terminal 200 is located, and the other first peripheral region 121.

For example, as illustrated by FIG. 1A, the embodiment of the present disclosure schematically shows that the number of first power voltage terminals 210 is one, the number of second power voltage terminals 220 is two, the first power voltage terminal 210 and the second power voltage terminal 220 are both located in the same first peripheral region 121, and the two second power voltage terminals 220 are located at two sides of the first power voltage terminal 210 to provide the second voltage signal for the annular second power signal line.

Figure 1B:
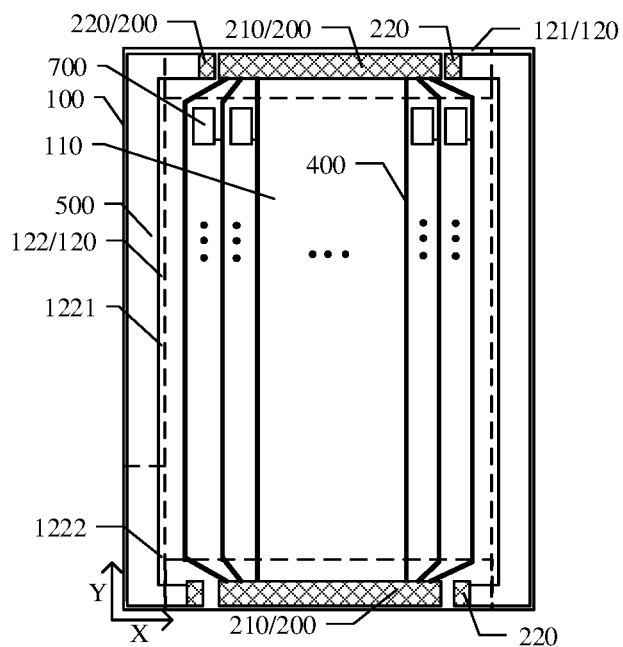
FIG. 1B is a schematic diagram of a partial planar structure of a display substrate according to another example of an embodiment of the present disclosure.

FIG. 1B is a schematic diagram of a partial planar structure of a display substrate according to another example of an embodiment of the present disclosure. The example shown in FIG. 1B differs from the example shown in FIG. 1A in that the number of first power voltage terminals 210 may be two and located in different first peripheral regions 121.

For example, the first power voltage terminal and the second power voltage terminal may be respectively located in the two first peripheral regions opposite to each other, and the two first power voltage terminals may be respectively located in the two first peripheral regions opposite to each other. In this case, a second peripheral region may include two first sub-regions and one second sub-region located between the two first sub-regions, and the two first sub-regions are respectively close to the two first power voltage terminals to reduce the voltage drop of the first power signal line.

For example, in the case where the number of first power voltage terminals 210 may be two and located in different first peripheral regions 121, the number of second sub-regions may be one and located between the two first sub-regions. For example, a midpoint of the second peripheral region may be located within the second sub-region.

For example, the second power voltage terminal may be located in only one first peripheral region or may be distributed in two first peripheral regions opposite to each other, and the embodiment of the present disclosure is not limited thereto.

For example, as illustrated by FIG. 1A, FIG. 2 and FIG. 3, the second power signal line 500 includes a first conductive layer 510, a portion of which is located on the slope 310 of the pixel defining layer 300, and because the average slope angle of the slope 310 in the first sub-region 1221 is larger than the average slope angle of the slope 310 in the second sub-region 1222, an average thickness of the first conductive layer 510 located on the slope 310 in the first sub-region 1221 is smaller than an average thickness of the first conductive layer 510 located on the slope 310 in the second sub-region 1222. The above-mentioned "average thickness" refers to an average value of thicknesses of the first conductive layer on the slope at different positions in each sub-region upon thicknesses of the first conductive layer on the slope at different positions of the pixel defining layer in each sub-region being different, for example, a ratio of the thicknesses of the first conductive layer on the slope at different positions in each sub-region may be 0.9-1.1, whereby the thickness relationship of the first conductive layer on the slope of different sub-regions in the present embodiment all refers to the magnitude relationship of average thicknesses of the first conductive layer on the slope of different sub-regions.

For example, a sheet resistance of the first conductive layer 510 on the slope 310 of the pixel defining layer 300 located in the first sub-region 1221 is greater than a sheet resistance of the first conductive layer 510 on the slope 310 of the pixel defining layer 300 located in the second sub-region 1222. The embodiment of the present disclosure sets the average slope angle of the pixel defining layer in the second sub-region to be smaller than the average slope angle of the pixel defining layer in the first sub-region, so that the average thickness of the first conductive layer formed on the slope of the pixel defining layer in the second sub-region is larger than the average thickness of the first conductive layer formed on the slope of the pixel defining layer in the first sub-region, whereby the sheet resistance of the first conductive layer in the second sub-region is smaller than the sheet resistance of the first conductive layer in the first sub-region.

For example, as illustrated by FIG. 1A, FIG. 2 and FIG. 3, the second power signal line 500 further includes a second conductive layer 520 located at a side of the first conductive layer 510 facing the base substrate 100, the second conductive layer 520 includes a first flat portion 521 and a second flat portion 522, the first flat portion 521 is located at a side of the second flat portion 522 close to the display region, a portion of the first flat portion 521 close to the second flat portion 522 is in direct contact with the first conductive layer 510, and a portion of the first flat portion 521 away from the second flat portion 522 is located between the pixel defining layer 300 and the base substrate 100. For example, a side of the second conductive layer 520 facing the base substrate 100 is also provided with a planarization layer 600, the planarization layer 600 includes a flat structure and a slope structure located in the peripheral region, the first flat portion 521 of the second conductive layer 520 is located on the flat structure of the planarization layer 600, the portion of the second conductive layer 520 other than the first flat portion 521 and the second flat portion 522 is located on the slope structure of the planarization layer 600, That is, the portion of the second conductive layer 520 located on the slope structure of the planarization layer 600 is located between the first flat portion 521 and the second flat portion 522, and the second flat portion 522 of the second conductive layer 520 is not overlapped with the planarization layer 600. FIG. 2 and FIG. 3 only illustrates a relationship between a thickness of the planarization layer and a thickness of the pixel defining layer, for example, the thickness of the planarization layer is less than the thickness of the pixel defining layer.

For example, as illustrated by FIG. 1A, FIG. 2 and FIG. 3, the second power signal line 500 further includes a third conductive layer 530 disposed on the same layer as the first power signal line 400, the first power signal line 400 is located between the pixel defining layer 300 and the base substrate 100, and the third conductive layer 530 is located at a side of the second flat portion 522 of the second conductive layer 520 facing the base substrate 100 and in direct contact with the second flat portion 522.

For example, as illustrated by FIG. 1A, FIG. 2 and FIG. 3, an orthographic projection of the first conductive layer 510 on the base substrate 100 is not overlapped with an orthographic projection of the third conductive layer 530 on the base substrate 100, whereby the first conductive layer can electrically connect with the third conductive layer through electrical connection with the second conductive layer.

The second power signal line provided by the embodiment of the disclosure includes the first conductive layer, the second conductive layer and the third conductive layer which are located on different layers, two sides of the second conductive layer are respectively in direct contact with the first conductive layer and the third conductive layer to achieve electrical connection among the three, and the third conductive layer is electrically connected with the second power voltage terminal to transmit an electrical signal of the second power voltage terminal to the first conductive layer.

In the embodiment of the present disclosure, the sheet resistance of the first conductive layer located in the first sub-region is greater than the sheet resistance of the first conductive layer located in the second sub-region, so as to allow the sheet resistance of the second power signal line located in the first sub-region close to the voltage terminal to be greater than the sheet resistance of the second power signal line located in the second sub-region away from the voltage terminal.

For example, a surface of the third conductive layer 530 facing the base substrate 100 is parallel to the plane of the base substrate 100. For example, the third conductive layer 530 is a non-closed annular planar layer surrounding the display region, and the third conductive layer 530 is directly electrically connected with the second power voltage terminal. Due to large width and small impedance of the third conductive layer, the annular third conductive layer approximately forms an equipotential surface. The first conductive layer located on the slope of the pixel defining layer in the first sub-region has a large sheet resistance due to its small thickness, resulting in a large voltage drop of the first conductive layer located on the slope. However, the thickness of the first conductive layer on the slope of the pixel defining layer located in the second sub-region is relatively large and the sheet resistance is relatively small, so that the first conductive layer located on the slope will cause a relatively small voltage drop.

For example, the pixel defining layer 300 located in the peripheral region includes a slope 310 and a third flat portion 320, the third flat portion 320 is located at a side of the slope 310 close to the display region, and a thickness of the first conductive layer 510 located on the slope 310 is smaller than a thickness of the first conductive layer 510 located on the third flat portion 320. Because the thickness of the first conductive layer on the slope of the pixel defining layer located in the first sub-region is relatively thin and the sheet resistance is relatively high, causing the first conductive layer located on the slope to cause a relatively large voltage drop, a voltage signal transmitted from the third conductive layer to the first conductive layer located on the third flat portion via the first conductive layer on the slope is, for example, VSS1. However, the thickness of the first conductive layer on the slope of the pixel defining layer located in the second sub-region is relatively large and the sheet resistance is relatively small, so that the first conductive layer located on the slope will cause a relatively voltage drop, then a voltage signal transmitted from the third conductive layer to the first conductive layer located on the third flat portion through the first conductive layer on the slope is, for example, VSS2, VSS2>VSS1. By adjusting the slope angle of the slope of the pixel defining layer in the second sub-region, the thickness of the first conductive layer located on the slope can be increased, thereby reducing the voltage drop generated during the voltage signal passing through the first conductive layer.

Figure 6:
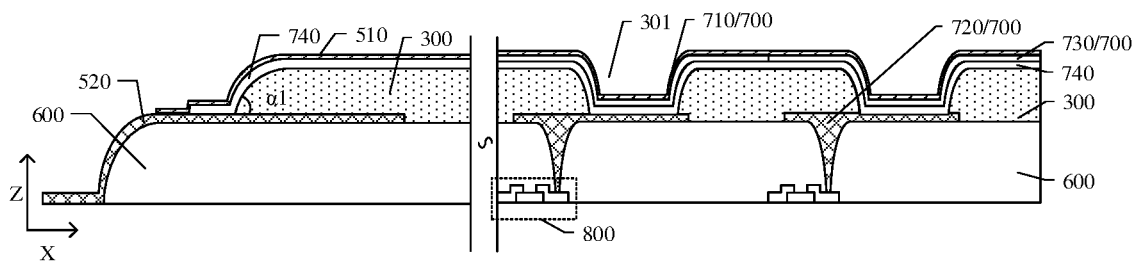
FIG. 6 is a schematic diagram of a cross-sectional structure of some film layers in the display region and the peripheral region.

For example, FIG. 6 is a schematic diagram of a cross-sectional structure of some film layers in the display region and the peripheral region. As illustrated by FIG. 1A to FIG. 6, the display substrate further includes a plurality of organic light emitting elements 700, each of the plurality of organic light emitting elements 700 includes a first electrode 710, an organic light emitting layer 730, and a second electrode 720, the first electrode 710, the organic light emitting layer 730, and the second electrode 720 are sequentially stacked; and the first electrode 710 is located at a side of the second electrode 720 away from the base substrate 100. The first electrodes 710 of the plurality of organic light emitting elements 700 form to be a continuous film layer so as to allow the plurality of organic light emitting elements 700 to share one first electrode 710, and the first electrode 710 is electrically connected with the second power voltage terminal 220 through the first conductive layer 510. For example, the first electrode 710 and the first conductive layer 510 may be of an integrated structure, then the first electrode 710 and the first conductive layer 510 are an integrally continuous film layer, a portion of the integrally continuous film layer distributed in the display region includes the first electrode of the organic light emitting element, and a portion of the integrally continuous film layer distributed in the peripheral region includes the first conductive layer of the second power signal line. The first electrode of the organic light emitting element is electrically connected with the second power voltage terminal through the first conductive layer, the second conductive layer and the third conductive layer of the second power signal line to receive a voltage signal.

For example, the second conductive layer 520 of the second power signal line 500 is disposed on the same layer as and spaced apart from the second electrode 720 of each of the plurality of organic light emitting elements 700, that is, the second electrode 720 of each of the plurality of organic light emitting elements 700 and the second conductive layer 520 of the second power signal line 500 may be made of the same material, formed in a one-step patterning process, and insulated from each other.

For example, the second electrode 720 of each organic light emitting element 700 is electrically connected with the first power voltage terminal 210 through the first power signal line 400. For example, the display substrate includes a plurality of sub-pixels, each of the plurality of sub-pixel includes an organic light emitting element 700 and a pixel circuit 800 through which the organic light emitting element 700 can be electrically connected with the first power signal line 400.

Figure 7:
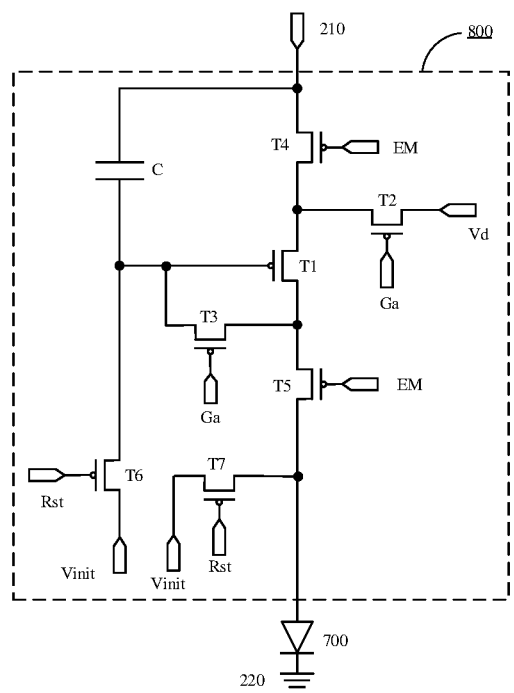
FIG. 7 is a schematic diagram of a pixel circuit included in each sub-pixel.

For example, FIG. 7 is a schematic diagram of a pixel circuit included in each sub-pixel. As illustrated by FIG. 7, the pixel circuit 800 of each sub-pixel may include a drive transistor T1, a first light emission control transistor T4, a second light emission control transistor T5, a data write transistor T2, a storage capacitor C, a threshold compensation transistor T3, a first reset transistor T6, and a second reset transistor T7. The driving transistor T1 includes a gate electrode, a first electrode, and a second electrode, and is configured to provide a driving current for driving the organic light emitting element 700 to emit light. The display substrate further includes a data line (not shown) provided on the same layer as the first power signal line, the data line and the first power signal line extend in the same direction. The display substrate further includes a gate line (not shown), a light emission control signal line (not shown), and a reset control signal line (not shown) located at a side of the first power signal line facing the base substrate, and the gate line, the light emission control signal line, and the reset control signal line are parallel to each other. An extending direction of the gate line intersects with an extending direction of the data line, for example, the extending direction of the gate line is perpendicular to the extending direction of the data line. The display substrate further includes a reset power signal line (not shown) extending in the first direction between the film layer where the gate line is located and the film layer where the data line is located.

For example, as illustrated by FIG. 7, a first electrode of the data writing transistor T2 is electrically connected with the first electrode of the driving transistor T1, a second electrode of the data writing transistor T2 is configured to be electrically connected with the data line Vd to receive a data signal, and a gate electrode of the data writing transistor T2 is configured to be electrically connected with the gate line Ga to receive a scan signal. A first electrode of the storage capacitor C is electrically connected with the first power voltage terminal 210, and a second electrode of the storage capacitor C is electrically connected with the gate electrode of the drive transistor T1. A first electrode of the threshold compensation transistor T3 is electrically connected with the second electrode of the drive transistor T1, a second electrode of the threshold compensation transistor T3 is electrically connected with the gate electrode of the drive transistor T1, and a gate electrode of the threshold compensation transistor T3 is configured to be electrically connected with the gate line Ga to receive a compensation control signal; a first electrode of the first reset transistor T6 is configured to be electrically connected with the reset power signal line Vinit to receive a reset signal, a second electrode of the first reset transistor T6 is electrically connected with the gate electrode of the drive transistor T1, and a gate electrode of the first reset transistor T6 is configured to be electrically connected with the reset control signal line Rst to receive a reset control signal; a first electrode of the second reset transistor T7 is configured to be electrically connected with the reset power signal line Vinit to receive a reset signal, a second electrode of the second reset transistor T7 is electrically connected with the second electrode of the organic light emitting element 700, and a gate electrode of the second reset transistor T7 is configured to be electrically connected with the reset control signal line Rst to receive a reset control signal; a first electrode of the first light emission control transistor T4 is electrically connected with the first power voltage terminal 210, a second electrode of the first light emission control transistor T4 is electrically connected with the first electrode of the drive transistor T1, and a gate electrode of the first light emission control transistor T4 is configured to be electrically connected with the light emission control signal line EM to receive a light emission control signal; a first electrode of the second light emission control transistor T5 is electrically connected with the second electrode of the drive transistor T1, a second electrode of the second light emission control transistor T5 is electrically connected with the second electrode of the organic light emitting element 700, and a gate electrode of the second light emission control transistor T5 is configured to be electrically connected with the light emission control signal line EM to receive a light emission control signal; a first electrode of the organic light emitting element 700 is electrically connected with the second power voltage terminal 220.

For example, in the embodiment shown in FIG. 7, the first power voltage terminal 210 is a high-level voltage source to output a constant first voltage, and the first voltage is a positive voltage; the second power voltage terminal 220 may be a low-level voltage source to output a constant second voltage, which is a negative voltage. The first power voltage terminal and the second power voltage terminal are configured to provide power voltage to pixels (such as organic light emitting elements) in the display region.

For example, according to the characteristics of transistors, transistors can be divided into N-type transistors and P-type transistors. The embodiment of the present disclosure takes the transistors being P-type transistors (for example, P-type MOS transistors) as an example, that is, in the description of the present disclosure, the driving transistor T1, the data writing transistor T2, the threshold compensation transistor T3, the first light emission control transistor T4, the second light emission control transistor T5, the first reset transistor T6, the second reset transistor T7, etc. can be P-type transistors. However, the transistors of the embodiments of the present disclosure are not limited to P-type transistors, and those skilled in the art can also utilize N-type transistors (e.g., N-type MOS transistors) to realize the functions of one or more transistors in the embodiments of the present disclosure according to actual needs. The transistors used in the embodiments of the present disclosure may be thin film transistors, field effect transistors or other switching devices with the same characteristics, and the thin film transistors may include oxide semiconductor thin film transistors, amorphous silicon thin film transistors, or polysilicon thin film transistors, etc. source electrode and drain electrode of the transistor can be symmetrical in structure, so the source electrode and the drain electrode of the transistor can be indistinguishable in physical structure. In the embodiment of the present disclosure, in order to distinguish transistors, except for the gate electrode serving as the control electrode, one of the source electrode and the drain electrode is directly described as the first electrode, and the other is directly described as the second electrode, thus, the first electrode and the second electrode of all or part of the transistors in the embodiment of the present disclosure are interchangeable as required.

It should be noted that in the embodiment of the present disclosure, the pixel circuit may be a structure including other numbers of transistors, such as a 7T2C structure, a 6T1C structure, a 6T2C structure or a 9T2C structure, in addition to the 7T1C (i.e., seven transistors and one capacitor) structure shown in FIG. 7. The embodiments of the present disclosure are not limited thereto.

The first power signal line located in the display region has a certain impedance, resulting in a difference between the voltage signal in a portion of the first power signal line close to the voltage terminal and the voltage signal in a portion of the first power signal line away from the voltage terminal, that is, a voltage drop exists in the portion of the first power signal line away from the voltage terminal by comparing the voltage signal in the portion of the first power signal line away from the voltage terminal with the voltage signal in the portion of the first power signal line close to the voltage terminal. In a display substrate, an average slope angle of a pixel defining layer in a region away from a voltage terminal and an average slope angle of the pixel defining layer in a region close to the voltage terminal are substantially the same and are both large slope angles, then because the first conductive layer, located on a slope with a large slope angle of a pixel defining layer, in a second power signal line has a relatively small thickness, the voltage signal in a portion of the second power signal line close to the voltage terminal is larger than the voltage signal in a portion of the second power signal line away from the voltage terminal. For example, upon the voltage signal transmitted by the second power signal line being a negative voltage, the voltage drops occurring in the first power signal line and the second power signal line will cause a driving voltage $\Delta V1$ (a difference between the voltage signal at the first power voltage terminal and the voltage signal at the second power voltage terminal to drive the organic light emitting element to emit light) at two terminals of the organic light emitting element close to the voltage terminal to be larger than a driving voltage $\Delta V2$ at two ends of the organic light emitting element away from the voltage terminal, and a difference between the driving voltage close to the voltage terminal and the driving voltage away from the voltage terminal is $\Delta V1-\Delta V2=\Delta V3$. Taking the above display substrate having a driving voltage difference of $\Delta V3$ as a first display substrate as an example for description, in the embodiment of the present disclosure, the average slope angle of the slope of the pixel defining layer in the first sub-region close to the voltage terminal is set to be the same as the average slope angle of the slope of the pixel defining layer in the region close to the voltage terminal in the first display substrate, and the average slope angle of the slope of the pixel defining layer in the second sub-region away from the voltage terminal is set to be smaller than the average slope angle of the slope of the pixel defining layer in the region away from the voltage terminal in the first display substrate, so that, in the embodiment of the present disclosure, the average thickness of the first conductive layer of the second power signal line formed in the second sub-region is larger than the average thickness of the first conductive layer of the second power signal line formed in the first sub-region, thereby making the sheet resistance of the second power signal line in the second sub-region smaller than the sheet resistance of the second power signal line in the first sub-region. In contrast to the case where the sheet resistance of the second power signal line in the region close to the voltage terminal and the sheet resistance of the second power signal line in the region away from the voltage terminal are equal in the first display substrate, the sheet resistance of the second power signal line in the first sub-region in the embodiment of the present disclosure remains unchanged while the sheet resistance of the second power signal line in the second sub-region becomes smaller, so that a voltage drop of the second power signal line in the second sub-region is smaller than a voltage drop of the second power signal line in the first sub-region.

Therefore, in the embodiment of the present disclosure, the driving voltage at two terminals of the organic light emitting element close to the voltage terminal is $\Delta V1'$, the driving voltage $\Delta V1'$ satisfies a relationship of $\Delta V1'=\Delta V1$, and the driving voltage at two terminals of the organic light emitting element away from the voltage terminal is $\Delta V2'$, then $\Delta V1'$ and $\Delta V2'$ satisfies a relationship of $\Delta V1'-\Delta V2'=\Delta V3'$. Upon a negative voltage signal being input to the second power voltage terminal, because $\Delta V2'>\Delta V2$, then $\Delta V3'<\Delta V3$. Thus, the present disclosure can reduce the difference between the driving voltage of the organic light emitting element close to the voltage terminal and the driving voltage of the organic light emitting element away from the voltage terminal. For example, a write voltage at the first power voltage terminal may be 4.6V and a write voltage at the second power voltage terminal may be −3V, then in a row of organic light emitting elements connected by the first power signal line extending in the second direction, the write voltage of the second electrode of the organic light emitting element close to the first power voltage terminal may be 4.6V, and the write voltage of the second electrode of the organic light emitting element away from the first power voltage terminal may be 4.3V; a voltage written to the first electrode of the organic light emitting element connected with the second power signal line in the first sub-region can be −2.7V and a voltage written to the first electrode of the organic light emitting element connected with the second power signal line in the second sub-region can be −2.9V, then the driving voltage for the organic light emitting element close to the voltage terminal is 7.3, i.e., $\Delta V1'=7.3V$, and the driving voltage for the organic light emitting element away from the voltage terminal is 7.2, i.e., $\Delta V2'=7.2V$; thus, $\Delta V1'z'\Delta V2'$.

By adjusting the slope angle of the pixel defining layer away from the voltage terminal, the embodiment of the disclosure can reversely compensate the voltage drop generated by the first power signal line, so that the difference between the driving voltage of the organic light emitting element close to the voltage terminal and the driving voltage of the organic light emitting element away from the voltage terminal is reduced, so that the driving voltage of the organic light emitting element close to the voltage terminal and the driving voltage of the organic light emitting element away from the voltage terminal are relatively close, and the driving voltages of the organic light emitting elements at various positions in the display substrate are more uniform, thereby alleviating the problem of uneven display brightness of the display device and improving the display quality of the display device. In addition, the embodiment of the present disclosure can achieve low-cost improvement on the basis of the original circuit by keeping the average slope angle of the slope of the pixel defining layer close to the voltage terminal unchanged and reducing the average slope angle of the slope of the pixel defining layer away from the voltage terminal with respect to the case where the average slope angle of the slope of the pixel defining layer close to the voltage terminal and the average slope angle of the slope of the pixel defining layer away from the voltage terminal in the peripheral region are substantially equal.

For example, the thickness at a position of the third flat portion of the pixel defining layer located in the peripheral region may be 2 microns, the average slope angle of the slope of the pixel defining layer located in the first sub-region may be not less than 45 degrees, where the voltage drop range of the second power signal line is 0.3V to 0.5V; and the average slope angle of the slope of the pixel defining layer located in the second sub-region may be less than 30 degrees, where voltage drop range of the second power signal line is 0.1V to 0.3V, so that the driving voltage of the organic light emitting element close to the voltage terminal and the driving voltage of the organic light emitting element away from the voltage terminal can be relatively close by adjusting the average slope angle of the slope of the pixel defining layer in the peripheral region away from the voltage terminal.

For example, the thickness at a position of the third flat portion of the pixel defining layer located in the peripheral region may be 1.5 microns, the average slope angle of the slope of the pixel defining layer located in the first sub-region may be not less than 30 degrees, where the voltage drop range of the second power signal line is 0.1 V to 0.3V; and the average slope angle of the slope of the pixel defining layer located in the second sub-region may be less than 20 degrees, where voltage drop of the second power signal line is not more than 0.1V, so that the driving voltage of the organic light emitting element close to the voltage terminal and the driving voltage of the organic light emitting element away from the voltage terminal can be relatively close by adjusting the average slope angle of the slope of the pixel defining layer in the peripheral region away from the voltage terminal.

For example, as illustrated by FIG. 2 to FIG. 6, the organic light emitting element 700 further includes a functional layer 740, which may be a continuous film layer covering the pixel defining layer 300, so that both the first electrode and the functional layer are continuous film layers. For example, the functional layer may be at least one selected from the group consisting of an electron transport layer, an electron injection layer, a hole transport layer, and a hole injection layer. FIG. 6 schematically shows that the functional layer 740 is located between the organic light emitting layer 730 and the second electrode 720, but the present embodiment is not limited thereto, and the functional layer may also be located between the organic light emitting layer and the first electrode. For example, assuming that the functional layer 740 covers the slope 310 of the pixel defining layer 300 in the peripheral region, the first conductive layer 510 completely covers the functional layer 740, and a portion of the first conductive layer 510 extending outward from the functional layer 740 is in direct contact with the second conductive layer 520. The present embodiment is not limited thereto, the functional layer may not cover the edge of the pixel defining layer located in the peripheral region, whereby the first conductive layer directly covers the slope of the pixel defining layer.

For example, as illustrated by FIG. 2 and FIG. 3, the embodiment of the present disclosure schematically shows that a wiring region 810 for defective testing, a reset power wiring region 830 and a gate drive circuit 820 are further provided between the planarization layer 600 in the peripheral region and the base substrate 100. The reset power wiring region 830 includes a reset power wiring to be connected with the reset power signal line to transmit a reset signal thereto, a portion of the gate drive circuit 820 may be connected with the gate line to provide a scan signal, and another portion of the gate drive circuit 820 may be connected with the light emission control signal line to provide a light emission control signal.

An embodiment of the present disclosure provides a display device including the above display substrate.

The display device provided by the embodiment of the disclosure is an organic light emitting diode display device. By adjusting the slope angle of the pixel defining layer away from the voltage terminal, the voltage drop occurring in the first power signal line can be reversely compensated so as to reduce the difference between the driving voltage of the organic light emitting element close to the voltage terminal and the driving voltage of the organic light emitting element away from the voltage terminal, so that the driving voltage of the organic light emitting element close to the voltage terminal and the driving voltage of the organic light emitting element away from the voltage terminal are relatively close, and the driving voltages of the organic light emitting elements at various positions in the display device are more uniform, thereby alleviating the uneven display brightness of the display device and improving the display quality of the display device. In addition, the embodiment of the present disclosure can realize low-cost improvement on the basis of the original circuit by keeping the average slope angle of the slope of the pixel defining layer close to the voltage terminal unchanged and reducing the average slope angle of the slope of the pixel defining layer away from the voltage terminal with respect to the case where the average slope angle of the slope of the pixel defining layer close to the voltage terminal and the average slope angle of the slope of the pixel defining layer away from the voltage terminal of the general peripheral region are substantially equal.

Figure 8:
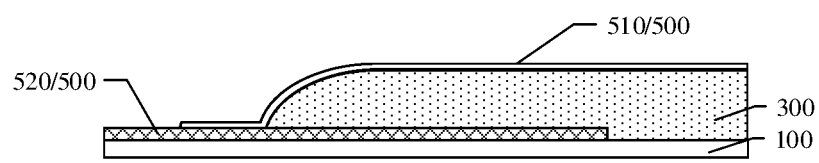
FIG. 8 is a schematic diagram of a partial cross-sectional structure of film layers according to another embodiment of the present disclosure.
Figure 9:
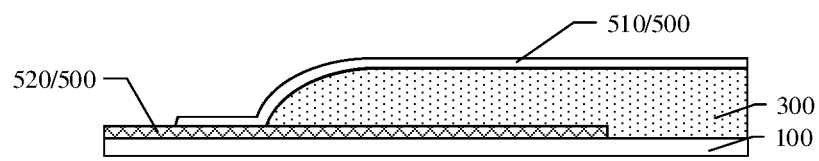
FIG. 9 is a schematic diagram of a partial cross-sectional structure of film layers according to another embodiment of the present disclosure.

FIG. 8 and FIG. 9 are schematic diagrams of a partial cross-sectional structure of film layers according to another embodiment of the present disclosure. The planar view of a display substrate in the embodiment shown in FIG. 8 and FIG. 9 may be the same as that of the display substrate shown in FIG. 1A, taking the planar view of the display substrate in the example as the planar view shown in FIG. 1A as an example, FIG. 8 is a schematic diagram of a partial cross-sectional structure of film layers, taken along the line AA shown in FIG. 1A; FIG. 9 is a schematic diagram of a partial cross-sectional structure taken along the line BB shown in FIG. 1A. As illustrated by FIG. 1A, FIG. 8, and FIG. 9, the display substrate includes a base substrate 100, a voltage terminal 200, a first power signal line 400, and a second power signal line 500 located on the base substrate 100. The display substrate includes a display region 110 and a peripheral region 120 surrounding the display region 110. The voltage terminal 200 is located in a first peripheral region 121, and includes a first power voltage terminal 210 and a second power voltage terminal 220. The first power voltage terminal is configured to provide a first power voltage signal to an organic light emitting element located in the display region, and the second power voltage terminal is configured to provide a second power voltage signal to the organic light emitting element. Positions and numbers of the first power voltage terminals and the second power voltage terminals in the present embodiment may be the same as those in the above embodiments, and the repeated portions will be omitted herein. The first power signal line 400 is located in the display region 110 and extends in the second direction. The first power signal line 400 is electrically connected with the first power voltage terminal 210. The first power signal line 400 has the same characteristics as the first power signal line in the above embodiments, and the repeated portions will be omitted herein. The second power signal line 500 is located in the peripheral region 120, and is electrically connected with the second power voltage terminal 220. The second peripheral region 122 includes at least two sub-regions arranged along the second direction, the at least two sub-regions includes a first sub-region 1221 closest to the voltage terminal and a second sub-region 1222 furthest from the voltage terminal. Position and magnitude relationships of the sub-regions in the second peripheral region in the present embodiment are the same as that of the sub-regions in the above embodiment, and the repeated portions will be omitted herein.

As illustrated by FIG. 8, the second power signal line 500 includes a conductive layer 510, and an average thickness of the conductive layer 510 located in the first sub-region 1221 is smaller than an average thickness of the conductive layer 510 located in the second sub-region 1222.

For example, the conductive layer 510 in the second power signal line 500 in the embodiment of the present disclosure may be the first conductive layer 510 in the embodiment shown in FIGS. 2-3, but is not limited thereto, for example, the conductive layer 510 in the second power signal line 500 in the embodiment of the present disclosure may also be the second conductive layer 520 in the embodiment shown in FIGS. 2-3.

For example, the conductive layer 510 in the second power signal line 500 in the embodiment of the present disclosure may be the first conductive layer 510 in the embodiment shown in FIGS. 2-3. In this case, the embodiment of the present disclosure may include a pixel defining layer as the embodiment illustrated by FIGS. 2-3, the average slope angle of the slope of the pixel defining layer in the second sub-region can be changed to adjust the sheet resistance of the conductive layer 510 in the second sub-region.

For example, in the embodiment of the present disclosure, the thickness of the conductive layer 510 formed in the second sub-region can be directly changed without changing the slope angle of the slope of the pixel defining layer, so that the sheet resistance of the conductive layer 510 located in the first sub-region 1221 is greater than the sheet resistance of the conductive layer 510 located in the second sub-region 1222.

For example, connection relationship and position relationship of other conductive layers in the second power signal line in the embodiment of the present disclosure may be the same as the second power signal line in the above embodiment, and the repeated portions will be omitted herein.

For example, the organic light emitting element and the pixel circuit included in the display substrate provided in the embodiment of the present disclosure may be the same as the organic light emitting element and the pixel circuit in the above embodiment, and the repeated portions will be omitted herein.

An embodiment of the present disclosure provides a mask plate that includes a plurality of openings (that is notches) for preparing patterns of a pixel defining layer of the OLED display substrate, a width of the opening close to a first side of the mask plate in a second direction is greater than a width of the opening away from the first side of the mask plate in the second direction, and the second direction is a direction from the opening close to the first side of the mask plate to the opening away from the first side of the mask plate. The mask plate includes a second side opposite to the first side, the second side corresponds to a position where IC is located.

In the patterns of the pixel defining layer of the OLED display substrate thus prepared with the mask plate of this embodiment, in a direction from one side of the OLED display substrate, such as a third side of the OLED display substrate corresponding to the second side of the mask plate, to the opposite side of the OLED display substrate, slope angles of the patterns of the pixel defining layer vary. In this way, it is possible to make the thickness of the cathode covering the slopes of the patterns of the pixel defining layer vary.

In one embodiment, regions configured with the plurality of openings comprises a $1^{st}$ region, a $2^{nd}$ region, . . . , and an $n^{th}$ region arranged sequentially in the second direction, each of the regions comprises at least one opening, and the openings in each region have an identical width in the second direction, and along the second direction, the width of the opening(s) in a $(k-1)^{th}$ region in the second direction is greater than the width of the opening(s) in a $k^{th}$ region in the second direction, where k is an integer greater than 1 and not greater than n. In one example, regions configured with the plurality of openings may comprise five regions arranged sequentially in the second direction, or may comprise other number of regions arranged sequentially in the second direction.

Figure 10:
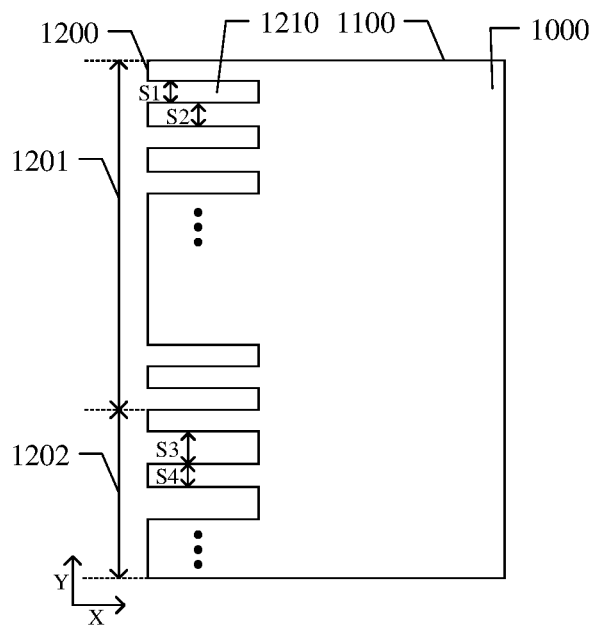
FIG. 10 is a schematic diagram of a mask plate used for forming a pixel defining layer in a peripheral region of the display substrate shown in FIG. 1A to FIG. 7 according to another embodiment of the present disclosure.

FIG. 10 shows a mask plate for forming the pixel defining layer in the peripheral region of the display substrate shown in FIG. 1A to FIG. 7 provided by another embodiment of the present disclosure. As illustrated by FIG. 10, the mask plate 1000 includes a first edge 1100 extending in the first direction (i.e., the X direction) and a second edge 1200 extending in the second direction (i.e., the Y direction). The second edge 1200 includes a plurality of notches 1210 arranged in a row along the second direction to form a serrated edge. The "notch" here is an opening of the mask plate 1000, and this notch is only located at the edge of the mask plate for forming the slope of the pixel defining layer located in the peripheral region. The second edge 1200 includes at least two mask regions arranged along the second direction, the at least two mask regions includes a first mask region 1201 corresponding to the first sub-region 1221 shown in FIG. 1A and a second mask region 1202 corresponding to the second sub-region 1222, and a size S1 of each notch 1210 in the first mask region 1201 along the second direction is smaller than a size S3 of each notch 1210 in the second mask region 1202 along the second direction. The notches of the mask plate provided by the embodiment of the disclosure are used for forming the slope of the pixel defining layer located in the peripheral region. The slope angle of the slope of the pixel defining layer is related to the width (i.e., the size in the second direction) of the opening (i.e., the notch) of the mask plate for forming the slope of the pixel defining layer. The larger the opening of the mask plate for forming the slope of the pixel defining layer, the smaller the slope angle of the slope of the pixel defining layer, the smaller the opening of the mask plate for forming the slope of the pixel defining layer, and the larger the slope angle of the slope of the pixel defining layer. Therefore, the slope angle of the slope of the pixel defining layer can be changed by controlling the width of the opening of the mask plate for forming the slope of the pixel defining layer, thereby changing the resistance value of the second power signal line located on the slope of the pixel defining layer. According to the embodiment of the disclosure, the widths of the notches for forming the slope of the pixel defining layer in the second sub-region is set to be larger than the widths of the notches for forming the slope of the pixel defining layer in the first sub-region, so that the average slope angle of the slope of the pixel defining layer in the second sub-region is smaller than the average slope angle of the slope of the pixel defining layer in the first sub-region, and further the thickness of the second power signal line on the slope in the second sub-region is relatively large and the sheet resistance is relatively small, which is beneficial to reducing the difference between the driving voltage of the organic light emitting element close to the voltage terminal and the driving voltage of the organic light emitting element away from the voltage terminal.

For example, as illustrated by FIG. 10, the notches 1210 have the same size in the first direction. That is, in the first direction, the notches 1210 in the first mask region 1201 have the same size as the notches 1210 in the second mask region 1202.

For example, as illustrated by FIG. 10, the notches 1210 in the first mask region 1201 have the same size in the second direction, which is S1. The notches 1210 in the second mask region 1202 have the same size in the second direction, which is S3.

For example, as illustrated by FIG. 10, a size S2 of an interval between two adjacent notches 1210 in the first mask region 1201 along the second direction is equal to a size S4 of an interval between two adjacent notches 1210 in the second mask region 1202 in the second direction, so as to facilitate the manufacture of the mask plate.

Figure 11A:
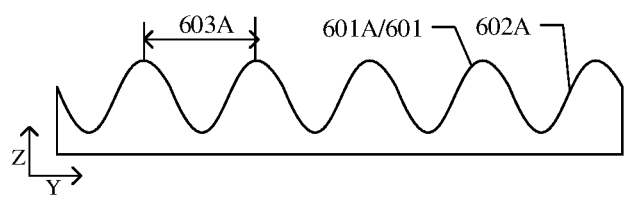
FIG. 11A is a schematic diagram of a partial cross-sectional structure of a pixel defining layer taken along a line DD shown in FIG. 1A.
Figure 11B:
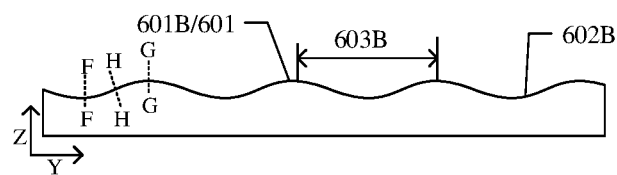
FIG. 11B is a schematic diagram of a partial cross-sectional structure of a pixel defining layer taken along a line EE shown in FIG. 1A.

For example, FIG. 11A is a schematic diagram of a partial cross-sectional structure of a pixel defining layer taken along a line DD shown in FIG. 1A, FIG. 11B is a schematic diagram of a partial cross-sectional structure of a pixel defining layer taken along a line EE shown in FIG. 1A. As illustrated by FIG. 10, FIG. 11A and FIG. 11B, upon serrated edge including the notches 1210 being used as a mask pattern to form a slope of the pixel defining layer 300, an orthographic projection of the slope in the second peripheral region on the base substrate includes a plurality of protrusions 601 arranged in the second direction, a distance between centerlines of adjacent two protrusions 601 in the second sub-region is greater than a distance between centerlines of adjacent two protrusions 601 in the first sub-region. For example, the protrusions 601 in the first sub-region includes first protrusions 601A, the protrusions 601 in the second sub-region includes second protrusions 601B, the distance 603A between the centerlines of adjacent two of the first protrusions 601A in the second direction is less than the distance 603B between the centerlines of adjacent two of the second protrusions 601B in the second direction.

As illustrated by FIG. 10, FIG. 11A and FIG. 11B, upon serrated edge including the notches 1210 being used as a mask pattern to form a slope of the pixel defining layer 300, a slope angle of a slope 602A (602B) formed at the position of the notches may be smaller than a slope angle of a slope 601A (601B) formed at the position of intervals between adjacent notches, so that the slope of the pixel defining layer 300 has a wavy shape with high and low undulations. That is, the mask plate at the notches forms the slope 602A (602B), and the mask plate at the interval between adjacent notches forms the slope 601A (601B). Thus, each sub-region includes a plurality of slopes 602A (602B) and slopes 601A (601B) alternately arranged, and for each sub-region, the average slope angle of the slope of the pixel defining layer is an average value of slope angles of the plurality of slopes 602A and slope angles of the plurality of slopes 601A (601B).

For example, as illustrated in FIG. 11B, taking the slope in the second sub-region as an example, the average slope angle of the slope in the second sub-region may refer to the average value of slope angles of the slope in the cross section taken along the FF line, HH line, GG line and other positions shown in FIG. 11B. The present disclosure is not limited thereto, the average slope angle of the slope in the second sub-region may also refer to the average value of slope angles of the slope 601B and the slope 602B in FIG. 11B.

For example, the size S1 of the notch 1210 in the first mask region 1201 in the second direction may be 1.5 microns, and the size S2 of the interval between adjacent notches 1210 in the second direction may be 1.5 microns. The size S3 of the notch 1210 in the second mask region 1202 in the second direction may be 2 microns, and the size S4 of the interval between adjacent notches 1210 in the second direction may be 1.5 microns.

Sizes of the notches at various positions in a mask plate for forming the slope of the pixel defining layer in the peripheral region of the first display substrate are equal, for example, the size S1, which is relatively small. In the embodiment of the present disclosure, the sizes of the notches in the first mask region close to the voltage terminal in the second direction are set to be the same as the sizes of the notches in a mask plate for forming the first display substrate, while the sizes of the notches in the second mask region away from the voltage terminal in the second direction are set to be larger than the sizes of the notches of the mask plate for forming the first display substrate, so that, in the embodiment of the present disclosure, the slope angle of the slope of the pixel defining layer in the second sub-region is smaller than the slope angle of the pixel defining layer in the first sub-region, so that the average thickness of the first conductive layer of the second power signal line formed in the second sub-region is larger than the average thickness of the first conductive layer of the second power signal line formed in the first sub-region, and further the sheet resistance of the second power signal line in the second sub-region is smaller than the sheet resistance of the second power signal line in the first sub-region.

In addition, with respect to the above-mentioned case where the sizes of the notches close to the voltage terminal and the sizes of the notches away from the voltage terminal of the mask plate are substantially equal in the second direction, the embodiment of the present disclosure can achieve low-cost improvement on the basis of the original circuit by keeping the sizes of the notches in the first mask region close to the voltage terminal unchanged and increasing the sizes of the notches in the second mask region away from the voltage terminal.

FIG. 10 only schematically shows the arrangement of the notches on the mask plate corresponding to one second peripheral region, in the embodiment of the present disclosure, in the case where the display substrate includes two second peripheral regions opposite to each other and the slope angles of the slope of the pixel defining layers provided by the two second peripheral regions have the same magnitude relationship, the arrangement and magnitude relationships of the notches on the mask plate corresponding to the other second peripheral region are the same as those shown in FIG. 10, i.e., each of two edges of the mask plate extending in the Y direction includes a row of the same notches. Of course, a row of notches may be provided on an edge, extending in the X direction, of the mask plate corresponding to the first peripheral region where no voltage terminal is provided, and the size of each notch in the X direction may be the same as the size of each notch corresponding to the first sub-region in the Y direction, so as to facilitate manufacture.

An embodiment of the present disclosure provides a method for manufacturing an OLED display substrate, comprising: forming a photosensitive material layer; and exposing and developing the photosensitive material layer by using the mask plate as described above to form patterns of a pixel defining layer.

Another embodiment of the present disclosure provides a manufacturing method of the display substrate shown in FIG. 1A to FIG. 7 using the mask plate shown in FIG. 10, including: providing a base substrate 100; forming a pixel defining material layer on the entire surface of the base substrate 100; and patterning the pixel defining material layer in the first sub-region 1221 and the second sub-region 1222 by using the mask plate to form the pixel defining layer 300 having the slope in the peripheral region, so as to allow the average slope angle of the slope 310 formed by the pixel defining layer 300 located in the first sub-region 1221 to be larger than the average slope angle of the slope 310 formed by the pixel defining layer 300 located in the second sub-region 1222. The notches of the mask plate provided by the embodiment of the present disclosure are used for patterning the slope of the pixel defining layer located in the peripheral region. The slope angle of the slope of the pixel defining layer is related to the widths (i.e., the sizes along the second direction) of the notches of the mask plate for forming the slope of the pixel defining layer. The larger the openings of the mask plate for forming the slope of the pixel defining layer, the smaller the slope angle of the slope of the pixel defining layer, the smaller the openings of the mask plate for forming the slope of the pixel defining layer, and the larger the slope angle of the slope of the pixel defining layer. Therefore, the slope angles of the slope of the pixel defining layer at different positions in the peripheral region can be changed by using a mask plate having different notch sizes to form the slope of the pixel defining layer. The embodiment of the present disclosure sets the widths of the notches for forming the slope of the pixel defining layer in the second sub-region to be larger than the widths of the notches for forming the slope of the pixel defining layer in the first sub-region, so that the average slope angle of the slope of the pixel defining layer in the second sub-region can be smaller than the average slope angle of the slope of the pixel defining layer in the first sub-region.

For example, as illustrated by FIG. 1A to FIG. 7, the manufacturing method provided by the embodiment of the present disclosure further includes: forming a first conductive material layer on a side of the pixel defining layer 300 away from the base substrate 100. The first conductive material layer includes a first conductive pattern layer located in the peripheral region 120, and an average thickness of the first conductive pattern layer located on the slope 310 of the pixel defining layer 300 in the first sub-region 1221 is smaller than an average thickness of the first conductive pattern layer located on the slope 310 of the pixel defining layer 300 in the second sub-region 1222. The first conductive pattern layer in the present embodiment is the first conductive layer 510 of the second power signal line shown in FIG. 1A to FIG. 7. In the case where the first conductive layer and the first electrode of the organic light emitting element are integrated as an integrated structure, the first conductive layer may refer to the first conductive material layer.

For example, as illustrated by FIG. 1A to FIG. 7, forming the pixel defining layer 300 further includes patterning the pixel defining material layer located in the display region 110 to form a plurality of openings 301, and before forming the pixel defining layer 300, the manufacturing method further includes: forming a second conductive material layer on the base substrate 100; patterning the second conductive material layer to form a first power signal line 400 located in the display region 110 and extending in the second direction and a second conductive pattern layer located in the peripheral region 120. The second conductive pattern layer in the present embodiment is the third conductive layer 530 of the second power signal line 500 as illustrated by FIG. 1A to FIG. 7.

For example, as illustrated by FIG. 1A to FIG. 7, after forming the second conductive pattern layer, the manufacturing method further includes: forming a third conductive material layer on a side of the second conductive material layer away from the base substrate 100; and patterning third conductive material layer to form a plurality of electrode blocks 720 located in the display region 110 and a third conductive pattern layer located in the peripheral region 120, and the plurality of openings 301 expose the plurality of electrode blocks 720. The electrode block 720 in the present embodiment is the second electrode 720 of the organic light emitting element 700 shown in FIG. 1A to FIG. 7. The third conductive pattern layer in the present embodiment is the second conductive layer 520 shown in FIG. 1A to FIG. 7.

For example, as illustrated by FIG. 1A to FIG. 7, the third conductive pattern layer (i.e., the second conductive layer 520) includes a first flat portion 521 located at a side of the second flat portion 522 close to the display region 110, a portion of the first flat portion 521 close to the second flat portion 522 is in direct contact with the first conductive pattern layer (i.e., the first conductive layer 510), a portion of the first flat portion 521 away from the second flat portion 522 is between the pixel defining layer 300 and the base substrate 100, and the second flat portion 522 is in direct contact with the second conductive pattern layer. The third conductive pattern layer formed in the present embodiment has the same characteristics as the second conductive layer shown in FIG. 1A to FIG. 7, and the repeated portions will be omitted herein.

For example, as illustrated by FIG. 1A to FIG. 7, after the pixel defining layer 300 is formed, the embodiment of the present disclosure further includes: forming an organic light emitting layer 730 in the plurality of openings 301 of the pixel defining layer 300 so as to allow the organic light emitting layer 730 to be in contact with the plurality of electrode blocks (i.e., the second electrode 720). A portion of the first conductive material layer located in the display region is the first electrode 710 of the organic light emitting element 700, and the electrode block is the second electrode 720 of the organic light emitting element 700. The organic light emitting element formed in the present embodiment has the same characteristics with the organic light emitting element shown in FIG. 1A to FIG. 7, and the repeated portions will be omitted herein.

For example, as illustrated by FIG. 1A to FIG. 7, the display substrate further includes a second power signal line 500 located in the peripheral region 120, and the second power signal line 500 includes the first conductive pattern layer (i.e., the first conductive layer 510), the second conductive pattern layer (the third conductive layer 530), and the third conductive pattern layer (the second conductive layer 520).

According to the manufacturing method of the display substrate provided by the embodiment of the disclosure, by reducing the average slope angle of the slope of the pixel defining layer away from the voltage terminal, the voltage drop occurring in the first power signal line can be reversely compensated, so that the difference between the driving voltage of the organic light emitting element close to the voltage terminal and the driving voltage of the organic light emitting element away from the voltage terminal is reduced, so that the driving voltage of the organic light emitting element close to the voltage terminal and the driving voltage of the organic light emitting element away from the voltage terminal are relatively close, and the driving voltages of the organic light emitting elements at various positions in the display device are more uniform, thereby alleviating the problem of uneven display brightness of the display device and improving the display quality of the display device. In addition, the embodiment of the present disclosure can achieve low-cost improvement on the basis of the original circuit by keeping the average slope angle of the slope of the pixel defining layer close to the voltage terminal unchanged and reducing the average slope angle of the slope of the pixel defining layer away from the voltage terminal with respect to the case where the average slope angle of the slope of the pixel defining layer close to the voltage terminal and the average slope angle of the slope of the pixel defining layer away from the voltage terminal of the general peripheral region are substantially equal.

The following should be explained.

(1) In the drawings of the embodiments of the present disclosure, only the structures related to the embodiments of the present disclosure are involved, and other structures may refer to the common design(s).

(2) In case of no conflict, features in one embodiment or in different embodiments of the present disclosure can be combined.

The above are only specific implementations of the present disclosure, but the protection scope of the present disclosure is not limited thereto. The protection scope of the present disclosure should be based on the protection scope of the claims.

What is claimed is:

1. A display substrate, comprising:
a base substrate, comprising a display region and a peripheral region surrounding the display region, the peripheral region comprising a first peripheral region extending in a first direction and a second peripheral region extending in a second direction, the first direction intersecting the second direction, and a size of the display region in the second direction being not greater than a size of the second peripheral region in the second direction;
a first power voltage terminal, located in the first peripheral region of the base substrate, and configured to provide a first power voltage signal to an organic light emitting element located in the display region;
a first power signal line, located in the display region and extending in the second direction, the first power signal line being configured to be electrically connected with the first power voltage terminal; and
a pixel defining layer, located in the display region and the peripheral region of the base substrate, and located at a side of the first power signal line away from the base substrate, the pixel defining layer being extended continuously from the display region to the peripheral region, and an edge of the pixel defining layer in the peripheral region comprising a slope,
wherein the second peripheral region comprises at least two sub-regions arranged along the second direction, the at least two sub-regions comprise a first sub-region and a second sub-region, the second sub-region is located on a side of the first sub-region away from the first power voltage terminal, and an average slope angle of the slope located in the first sub-region is greater than an average slope angle of the slope located in the second sub-region.

2. The display substrate according to claim 1, wherein the second peripheral region comprises only two sub-regions, in the second direction, a ratio of a length of the first sub-region to a length of the second sub-region ranges from 2.5 to 3.5, and lengths of the first sub-region and the second sub-region in the second direction are not less than 4 microns.

3. The display substrate according to claim 1, wherein a ratio of an average slope angle of the slope located in the first peripheral region to the average slope angle of the slope located in the first sub-region ranges from 0.90 to 1.10.

4. The display substrate according to claim 1, further comprising:
   a second power voltage terminal, located in the first peripheral region; and
   a second power signal line, located in the peripheral region and configured to be electrically connected with the second power voltage terminal to receive a second power voltage signal;
   wherein the second power signal line comprises a first conductive layer, at least a part of the first conductive layer is located on the slope, and an average thickness of the first conductive layer located on the slope in the first sub-region is smaller than an average thickness of the first conductive layer located on the slope in the second sub-region.

5. The display substrate according to claim 4, wherein at least one sub-region is further provided between the first sub-region and the second sub-region, and average slope angles of the slope of the pixel defining layer in the sub-regions gradually decrease in a direction in which the first sub-region points to the second sub-region.

6. The display substrate according to claim 4, wherein the second power signal line further comprises a second conductive layer located at a side of the first conductive layer facing the base substrate, the second conductive layer comprises a first flat portion and a second flat portion, the first flat portion is located at a side of the second flat portion close to the display region, a portion of the first flat portion close to the second flat portion is in direct contact with the first conductive layer, and a portion of the first flat portion away from the second flat portion is located between the pixel defining layer and the base substrate;
   the second power signal line further comprises a third conductive layer disposed on the same layer as the first power signal line, and the third conductive layer is located at a side of the second flat portion facing the base substrate and is in direct contact with the second flat portion.

7. The display substrate according to claim 6, wherein an orthographic projection of the first conductive layer on the base substrate is not overlapped with an orthographic projection of the third conductive layer on the base substrate, and a surface of the third conductive layer facing the base substrate is parallel to a surface of the base substrate.

8. The display substrate according to claim 6, wherein the second power signal line is an annular signal line surrounding the display region.

9. The display substrate according to claim 6, further comprising:
   a plurality of organic light emitting elements, each of the plurality of organic light emitting elements comprising a first electrode, an organic light emitting layer, and a second electrode which are sequentially stacked, the first electrode being located at a side of the second electrode away from the base substrate,
   wherein first electrodes of the plurality of organic light emitting elements form to be a continuous film layer, so that the plurality of organic light emitting elements share one first electrode, and the first electrode is electrically connected with the second power voltage terminal through the first conductive layer; the second conductive layer is disposed on the same layer as and spaced apart from the second electrode of each organic light emitting element, and the first power voltage terminal is configured to provide the first power voltage signal to the second electrode through the first power signal line.

10. The display substrate according to claim 9, wherein the first electrode and the first conductive layer are integrated as an integrated structure.

11. The display substrate according to claim 4, wherein the base substrate has a rectangular shape, the base substrate comprises two first peripheral regions opposite to each other and two second peripheral regions opposite to each other, the first power voltage terminal and the second power voltage terminal are located in the same first peripheral region of the two first peripheral regions, and each of the two second peripheral regions comprises the first sub-region and the second sub-region.

12. The display substrate according to claim 4, wherein the pixel defining layer located in the peripheral region comprises the slope and a third flat portion, the third flat portion is located at a side of the slope close to the display region, and a thickness of the first conductive layer located on the slope is smaller than a thickness of the first conductive layer located on the third flat portion.

13. The display substrate according to claim 1, wherein an orthographic projection of the slope in the second peripheral region on the base substrate comprises a plurality of protrusions arranged in the second direction, a distance between centerlines of adjacent two protrusions in the second sub-region is greater than a distance between centerlines of adjacent two protrusions in the first sub-region.

14. A display device, comprising the display substrate according to claim 1.

15. A mask plate for forming the pixel defining layer in the peripheral region of the display substrate according to claim 1, comprising:
   a first edge extending in the first direction and a second edge extending in the second direction,
   wherein the second edge comprises a plurality of notches arranged in a row along the second direction to form a serrated edge, the second edge comprises at least two mask regions arranged along the second direction, the at least two mask regions comprise a first mask region corresponding to the first sub-region and a second mask region corresponding to the second sub-region, and a size of each notch in the first mask region along the second direction is smaller than a size of each notch in the second mask region along the second direction.

16. The mask plate according to claim 15, wherein sizes of the notches in the first mask region along the second direction are equal, and sizes of the notches in the second mask region along the second direction are equal;
   a size of an interval between two adjacent ones of the notches in the first mask region along the second direction is equal to a size of an interval between two adjacent ones of the notches in the second mask region along the second direction.

17. A manufacturing method of a display substrate using the mask plate according to claim 15, comprising:
  providing the base substrate; and
  forming a pixel defining material layer on the base substrate; and
  patterning the pixel defining material layer in the first sub-region and the second sub-region by using the mask plate to form the pixel defining layer having the slope in the peripheral region;
  wherein the average slope angle of the slope of the pixel defining layer formed in the first sub-region to be larger than the average slope angle of the slope of the pixel defining layer formed in the second sub-region.

18. The manufacturing method of the display substrate according to claim 17, further comprising:
  forming a first conductive material layer on a side of the pixel defining layer away from the base substrate,
  wherein the first conductive material layer comprises a first conductive pattern layer located in the peripheral region, and an average thickness of the first conductive pattern layer located on the slope in the first sub-region is smaller than an average thickness of the first conductive pattern layer located on the slope in the second sub-region.

19. The manufacturing method of the display substrate according to claim 18, wherein forming the pixel defining layer further comprises: patterning the pixel defining material layer located in the display region to form a plurality of openings, and before forming the pixel defining layer, the manufacturing method further comprising:
  forming a second conductive material layer on the base substrate;
  patterning the second conductive material layer to form the first power signal line located in the display region and extending in the second direction, and a second conductive pattern layer located in the peripheral region;
  forming a third conductive material layer on a side of the second conductive material layer away from the base substrate; and
  patterning the third conductive material layer to form a plurality of electrode blocks located in the display region, and a third conductive pattern layer located in the peripheral region, the plurality of openings expose the plurality of electrode blocks, the third conductive pattern layer comprising a first flat portion and a second flat portion, the first flat portion is located at a side of the second flat portion close to the display region, a portion of the first flat portion close to the second flat portion is in direct contact with the first conductive pattern layer, and the second flat portion is in direct contact with the second conductive pattern layer;

after the pixel defining layer is formed, the manufacturing method further comprises:
  forming an organic light emitting layer in the plurality of openings of the pixel defining layer,
  wherein a portion of the first conductive material layer located in the display region is a first electrode of each organic light emitting element, each of the plurality of the electrode blocks is a second electrode of each organic light emitting element,
  the display substrate further comprises a second power signal line located in the peripheral region, and the second power signal line comprises the first conductive pattern layer, the second conductive pattern layer, and the third conductive pattern layer.

20. A display substrate, comprising:
  a base substrate, comprising a display region and a peripheral region surrounding the display region, the peripheral region comprising a first peripheral region extending in a first direction and a second peripheral region extending in a second direction, the first direction intersecting the second direction, and a size of the display region in the second direction being not greater than a length of the second peripheral region;
  a voltage terminal, located in the first peripheral region, and comprising a first power voltage terminal and a second power voltage terminal, the first power voltage terminal being configured to provide a first power voltage signal to an organic light emitting element located in the display region, and the second power voltage terminal being configured to provide a second power voltage signal to the organic light emitting element;
  a first power signal line, located in the display region and extending in the second direction, the first power signal line being configured to be electrically connected with the first power voltage terminal;
  a second power signal line, located in the peripheral region, and configured to be electrically connected with the second power voltage terminal;
  wherein the second peripheral region comprises at least two sub-regions arranged along the second direction, the at least two sub-regions comprise a first sub-region and a second sub-region, the second sub-region is located on a side of the first sub-region away from the voltage terminal, the second power signal line comprises a conductive layer, and a sheet resistance of the conductive layer located in the first sub-region is greater than a sheet resistance of the conductive layer located in the second sub-region.

\* \* \* \* \*